(12) United States Patent
Jeon et al.

(10) Patent No.: US 6,914,836 B2
(45) Date of Patent: Jul. 5, 2005

(54) SENSE AMPLIFIER CIRCUITS USING A SINGLE BIT LINE INPUT

(75) Inventors: Byung-Gil Jeon, Kyunggi-do (KR); Mun-Kyu Choi, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 84 days.

(21) Appl. No.: 10/295,718

(22) Filed: Nov. 15, 2002

(65) Prior Publication Data

US 2003/0095457 A1 May 22, 2003

(30) Foreign Application Priority Data

Nov. 19, 2001 (KR) .......................................... 2001-71801

(51) Int. Cl.[7] .................................................. G11C 7/00
(52) U.S. Cl. ...................... 365/205; 365/145; 365/149; 365/189.09
(58) Field of Search .................................. 365/205, 145, 365/149, 189.09

(56) References Cited

U.S. PATENT DOCUMENTS

| | | | | |
|---|---|---|---|---|
| 5,841,718 A | * | 11/1998 | Watters et al. | ............... 365/208 |
| 5,883,846 A | * | 3/1999 | Lee | ............................. 365/207 |
| 6,185,142 B1 | * | 2/2001 | Hotta | .......................... 365/207 |
| 6,563,753 B1 | * | 5/2003 | Rickes et al. | ............... 365/205 |

\* cited by examiner

*Primary Examiner*—Hoai Ho
(74) *Attorney, Agent, or Firm*—Myers Bigel Sibley & Sajovec

(57) ABSTRACT

An integrated circuit memory device can include a memory cell circuit configured to store data and a sense amplifier circuit configured to sense and amplify the stored data provided as a first input to the sense amplifier circuit in comparison to a reference voltage provided as a second input to the sense amplifier circuit. A bit line electrically can be coupled to the memory cell circuit and indirectly electrically coupled to the first input of the sense amplifier circuit and configured to provide the stored data to the sense amplifier circuit. A reference voltage line can also be indirectly electrically coupled to the second input of the sense amplifier circuit and configured to provide the reference voltage to the sense amplifier circuit.

22 Claims, 7 Drawing Sheets

US 6,914,836 B2

SENSE AMPLIFIER CIRCUITS USING A SINGLE BIT LINE INPUT

RELATED APPLICATION

This application relies for priority upon Korean Patent Application No. 2001-71801, filed on Nov. 19, 2001, the contents of which are incorporated herein by reference in their entirety.

FIELD OF THE INVENTION

The present invention relates to memory devices in general, and more particularly, to sense amplifier circuits in memory devices.

BACKGROUND

As is known to those skilled in the art, a sense amplifier is one of components that determines an operating speed of a semiconductor memory device. For this reason, a sense amplifier that enables a high operating speed while maintaining its performance may be useful. A latch-type sense amplifier has been proposed as a sense amplifier meeting such requirements.

Various examples of a sense amplifier are disclosed, for example, in Korean Patent Publication No. 2002-9772 entitled "LOW-POWER SENSE AMPLIFIER FOR MEMORY", Korean Patent Publication No. 2000-41576 entitled "DATA SENSE AMP", Korean Patent Publication No. 1999-85068 entitled "DRIVING CIRCUIT FOR NON-VOLATILE FERROELECTRIC MEMORY DEVICE", U.S. Pat. No. 5,455,786 entitled "FERROELECTRIC MEMORY", U.S. Pat. No. 5,959,922 entitled "FERROELECTRIC RANDOM ACCESS MEMORY DEVICE WITH REFERENCE CELL ARRAY BLOCKS", U.S. Pat. No. 6,169,424 entitled "SELF-BIASING SENSE AMPLIFIER", Japanese Patent Publication No. 11-219591 entitled "SENSE AMPLIFIER FOR MEMORY ARRAYS", Japanese Patent Publication No. 12-76856 entitled "SEMI-CONDUCTOR STORAGE", and Japanese Patent Publication No. 11-260064 entitled "SENSE AMPLIFIER".

FIG. 1 is a circuit diagram illustrating a sense amplifier of a conventional semiconductor memory device. As illustrated in FIG. 1, a semiconductor memory device 10 includes a latch-type sense amplifier 12 connected between bit lines BLM and BLR. The sense amplifier 12 includes a pair of PMOS transistors MP0 and MP1 and a pair of NMOS transistors MN0 and MN1. The PMOS transistor MP0 has a current path formed between a signal line SAP and the bit line BLM, and a gate directly coupled to the bit line BLR. The PMOS transistor MP1 has a current path formed between the signal line SAP and the bit line BLR, and a gate directly coupled to the bit line BLM. The NMOS transistor MN0 has a current path formed between the bit line BLM and a signal line SAN, and a gate directly coupled to the bit line BLR. The NMOS transistor MN1 has a current path formed between the bit line BLR and the signal line SAN, and a gate directly coupled to the bit line BLM. A memory cell MC is coupled to the bit line BLM, and a reference voltage supply circuit 14 is coupled to the bit line BLR. The reference voltage supply circuit 14 includes a pair of NMOS transistors MN2 and MN3 and a capacitor Cr, which are connected with each other as illustrated in FIG. 1.

FIG. 2 is a timing diagram that illustrates operations of the sense amplifier of FIG. 1. With reference to FIGS. 1 and 2, an operation of the conventional sense amplifier will be now described in detail hereinafter.

As illustrated in FIG. 2, as a control signal REF_EN transitions from a low level to a high level, an electric charge (or charges) corresponding to a VRER voltage are stored in the capacitor Cr via the NMOS transistor MN3. An electric charge amount charged in the capacitor Cr is Cr*VREF. After the electric charges are charged in the capacitor Cr, the control signal REF_EN makes a high-to-low transition. Next, as a control signal DMP_EN transitions from a low level to a high level, the electric charges charged in the capacitor Cr are transferred to the bit line BLR via the NMOS transistor MN2. At the same time, electric charges stored in the memory cell MC are transferred to the bit line BLM. At this time, a voltage of the bit line BLM is higher or lower than that of the bit line BLR. For example, if data '1' is stored in the memory cell MC, a voltage (e.g., 1.1 V) of the bit line BLM is higher than that (e.g., 0.85 V) of the bit line BLR. If data '0' is stored in the memory cell MC, a voltage (e.g., 0.6) of the bit line BLM is lower than that (e.g., 0.85 V) of the bit line BLR. In other words, there is a relatively small voltage difference between the bit lines BLM and BLR. Thereafter, a power supply voltage Vcc is provided to the control signal line SAP, and a ground voltage GND, lower than a predetermined voltage, is provided to the control signal line SAN. That is, the minute voltage difference between the bit lines BLM and BLR is amplified by the sense amplifier.

The foregoing sense amplifier has shortcomings of a reduced sensing margin and a slow sensing speed. If, prior to an operation of the sense amplifier, a voltage difference between the bit lines BLM and BLR is greater than a turn-on voltage or a threshold voltage of the PMOS transistor, a voltage of the bit line BLM is discharged into the signal line SAP of a ground voltage GND which can in turn reduce the sensing margin of the sense amplifier. For example, in the event that the memory cell of data '1' is accessed, a voltage level (e.g., 1.1 V) provided by the memory cell MC can be reduced, and thereby become a low voltage, because of the electrical coupling between the signal line SAP and the bit line BLM. This can lead to a reduction in a voltage difference between the bit lines. Therefore, a sensing margin of the sense amplifier is reduced and a sensing speed is also lowered. Conversely, if, prior to an operation of the sense amplifier, a voltage difference between the bit lines BLM and BLR is greater than a turn-on voltage or a threshold voltage of the NMOS transistor, a predetermined voltage Va of the signal line SAN is provided to the bit line BLM or BLR via the NMOS transistor MN0 thereby possibly changing the respective voltage provided on either the bit line BLM or the bit line BLR. For example, in the event that the memory cell MC provides a data '0', a voltage (e.g., 0.6 V) which would otherwise be provided on the bit line BLM can be increased by the coupling of the voltage from the signal line SAN onto the bit line BLM. This can lead to a reduction in a voltage difference between the bit lines BLM and BLR. Therefore, a sensing margin of the sense amplifier is reduced and a sensing speed is also lowered.

In the case of the conventional reference voltage supply circuit 14, the capacitor Cr is charged with electric charges transferred via the NMOS transistor MN3, and the charged electric charges are transferred to the bit line BLR via the NMOS transistor MN2. For this reason, the sense amplifier may not be operated until after the electric charges in the capacitor Cr are transferred to the bit line BLR. This can reduce the sensing speed of the sense amplifier. Furthermore, because a loading capacitance of the bit line BLM is different from that of the bit line BLR, the sensing performance of the sense amplifier may be affected.

The foregoing reference voltage provided to the sense amplifier circuit can be generated using a paraelectric capacitor that is different from a ferroelectric capacitor of the memory cell. The reference voltage may be generated using a ferroelectric capacitor that is the same as that of the memory cell. Reference voltage generating circuits are disclosed, for example, in U.S. Pat. No. 6,097,624 entitled "METHODS OF OPERATING FERROELECTRIC MEMORY DEVICES HAVING RECONFIGURABLE BIT LINES". The reference voltage generating circuit of the '624 patent is illustrated in FIG. 3. Referring to FIG. 3, the reference voltage generating circuit 350 includes a pair of NMOS transistors 351 and 353 and a pair of ferroelectric capacitors 352 and 354. The ferroelectric capacitors 352 and 354 of the reference voltage generating circuit 350 are formed to be the same as a ferroelectric capacitor 312 of a memory cell 310. By using the ferroelectric capacitor, a reference voltage may be generated to be similar to a state of the memory cell.

In this case, however, a ferroelectric capacitor of a single reference voltage generating circuit should undertake write/read operations of a plurality of memory cells. This may deteriorate a fatigue characteristic, which is peculiar to ferroelectric materials. With respect to the reference voltage generating circuit 350 of the '624 patent, a reference voltage is generated by applying electric charges of a ferroelectric capacitor to a bit line. That is, the ferroelectric capacitor of the reference voltage generating circuit 350 can have the same distribution of electric charges as that of the memory cell. The distribution of electric charges can make the reference voltage non-uniform (or, the distribution of electric charges can cause the reference voltage to be distributed within a predetermined range). As a result, the sensing margin of the sensing amplifier can be reduced.

SUMMARY

In some embodiments according to the present invention, an integrated circuit memory device can include a memory cell circuit configured to store data and a sense amplifier circuit configured to sense and amplify the stored data provided as a first input to the sense amplifier circuit in comparison to a reference voltage provided as a second input to the sense amplifier circuit. A bit line electrically can be coupled to the memory cell circuit and indirectly electrically coupled to the first input of the sense amplifier circuit and configured to provide the stored data to the sense amplifier circuit. A reference voltage line can also be indirectly electrically coupled to the second input of the sense amplifier circuit and configured to provide the reference voltage to the sense amplifier circuit.

In some embodiments according to the present invention, the bit line can be indirectly electrically coupled to the first input of the sense amplifier circuit through an active load element. In some embodiments according to the present invention, the active load element can be electrically coupled between a supply voltage and an output of the sense amplifier circuit and can be configured to control a current between the supply voltage and the output.

In some embodiments according to the present invention, the voltage reference line can be indirectly electrically coupled to the second input of the sense amplifier circuit through an active load element. In some embodiments according to the present invention, the integrated circuit memory device can further include an output circuit that can be configured to conduct the output from the sense amplifier circuit to the bit line during an output timing interval.

In accordance with some aspects of the present invention, there is provided a semiconductor memory device includes at least a pair of bit lines. The semiconductor memory device comprises a selection circuit for selecting one of the bit lines. A precharge circuit precharges the selected bit line. A direct current (DC) voltage generating circuit generates a predetermined bias voltage by using a power supply voltage. A reference voltage generating circuit receives the bias voltage and generates a reference voltage in response to first and second control signals. At this time, the reference voltage is lower than the bias voltage. Also, a sense amplifier circuit performs a sense and amplification operation according to a voltage on the selected bit line and the reference voltage.

The sense amplifier circuit includes a latch-type sense amplifier. The latch-type amplifier is coupled between first and second signal lines and amplifies a voltage difference between first and second terminals. An equalizer is coupled between the first and second terminals and equalizes voltages of the first and second terminals in response to the first control signal. A first active load element is coupled between the first signal line and the first terminal and has a resistance value varied according to a voltage of the bit line. A second active load element is coupled between the first signal line and the second terminal and has a resistance value varied according to the reference voltage. The semiconductor memory device further includes means for transferring an amplified voltage of the first terminal to a complementary bit line and an amplified voltage of the second terminal to the bit line in response to the second control signal.

In accordance with another aspect of the present invention, there is provided a semiconductor memory device including a sense amplifier that is connected to a sense amplification enable signal line and to a ground voltage and amplifies a voltage difference between first and second terminals. A first PMOS transistor is coupled between the sense amplification enable signal line and the first terminal of the sense amplifier and is controlled by a voltage of the first bit line. A second PMOS transistor is coupled between the sense amplification enable signal line and the second terminal of the sense amplifier and is controlled by a predetermined DC reference voltage. A first NMOS transistor is coupled between the first and second terminals and is controlled by a first control signal. A second NMOS transistor is coupled between the first terminal of the sense amplifier and the first bit line, and a third NMOS transistor is coupled between the second terminal of the sense amplifier and the second bit line. Here, the second and third NMOS transistors are commonly controlled by a second control signal.

In accordance with still another aspect of the present invention, there is provided a semiconductor memory device including a sense amplifier that is connected to a sense amplification enable signal line and to a ground voltage and amplifies a voltage difference between first and second terminals. A first NMOS transistor is coupled between the first terminal of the sense amplifier and the ground voltage and is controlled by a voltage of a first bit line. A second NMOS transistor is coupled between the second terminal of the sense amplifier and the ground voltage and is controlled by a predetermined DC reference voltage. A third NMOS transistor is coupled between the first and second terminals and is controlled by a first control signal. A fourth NMOS transistor is coupled between the first terminal of the sense amplifier and the first bit line, and a fifth NMOS transistor is coupled between the second terminal of the sense amplifier and a second bit line. Here, the fourth and fifth NMOS transistors are commonly controlled by a second control signal.

DESCRIPTION OF EMBODIMENTS ACCORDING TO THE PRESENT INVENTION

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
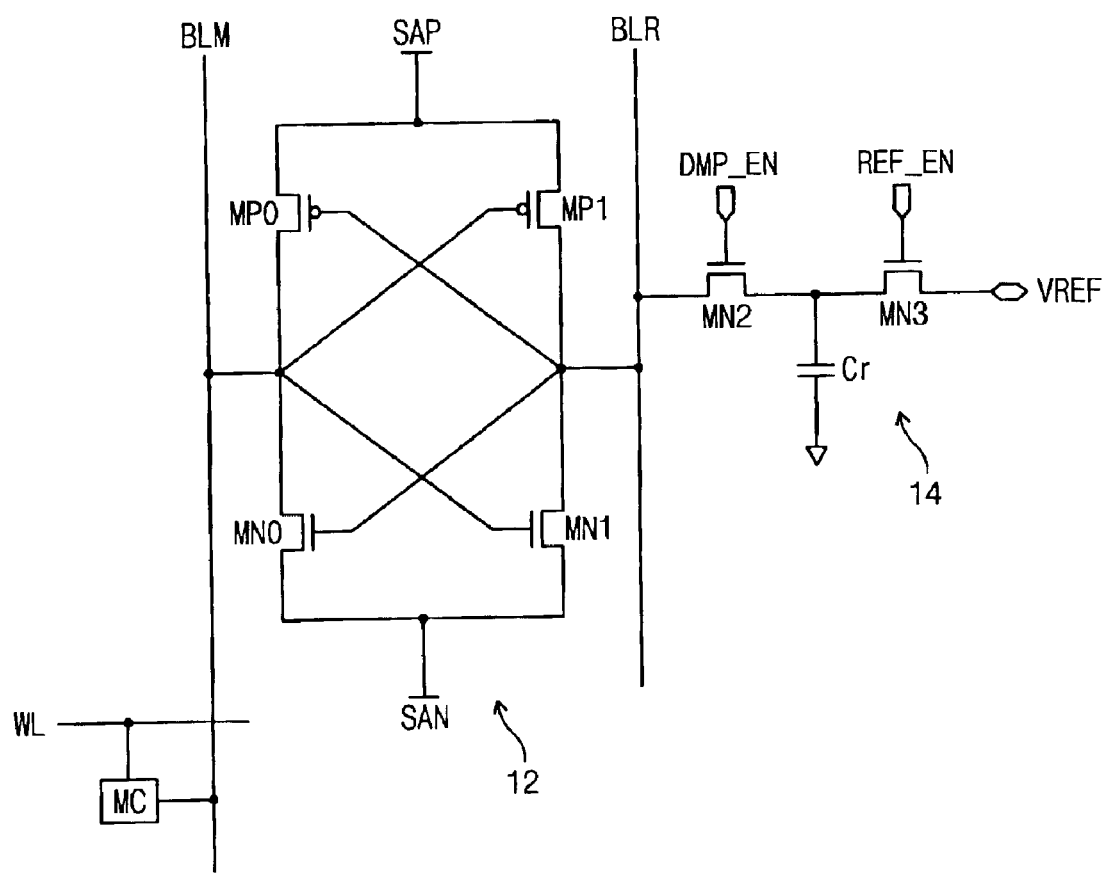
FIG. 1 is a circuit diagram of a conventional sense amplifier.
Figure 2:
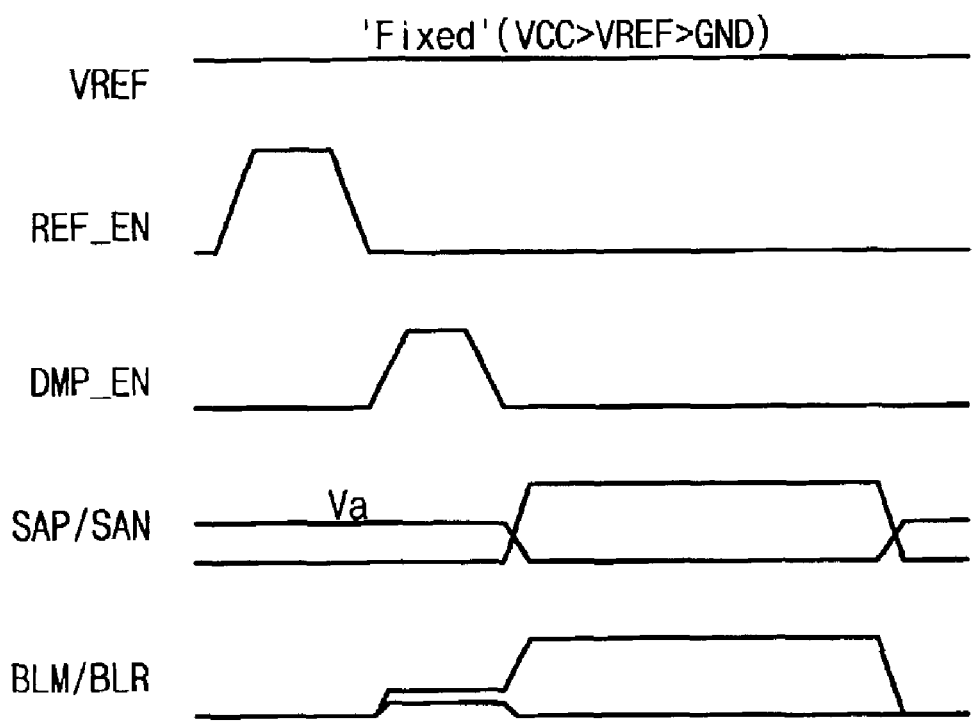
FIG. 2 is a timing diagram illustrating operations of the sense amplifier of FIG. 1.
Figure 3:
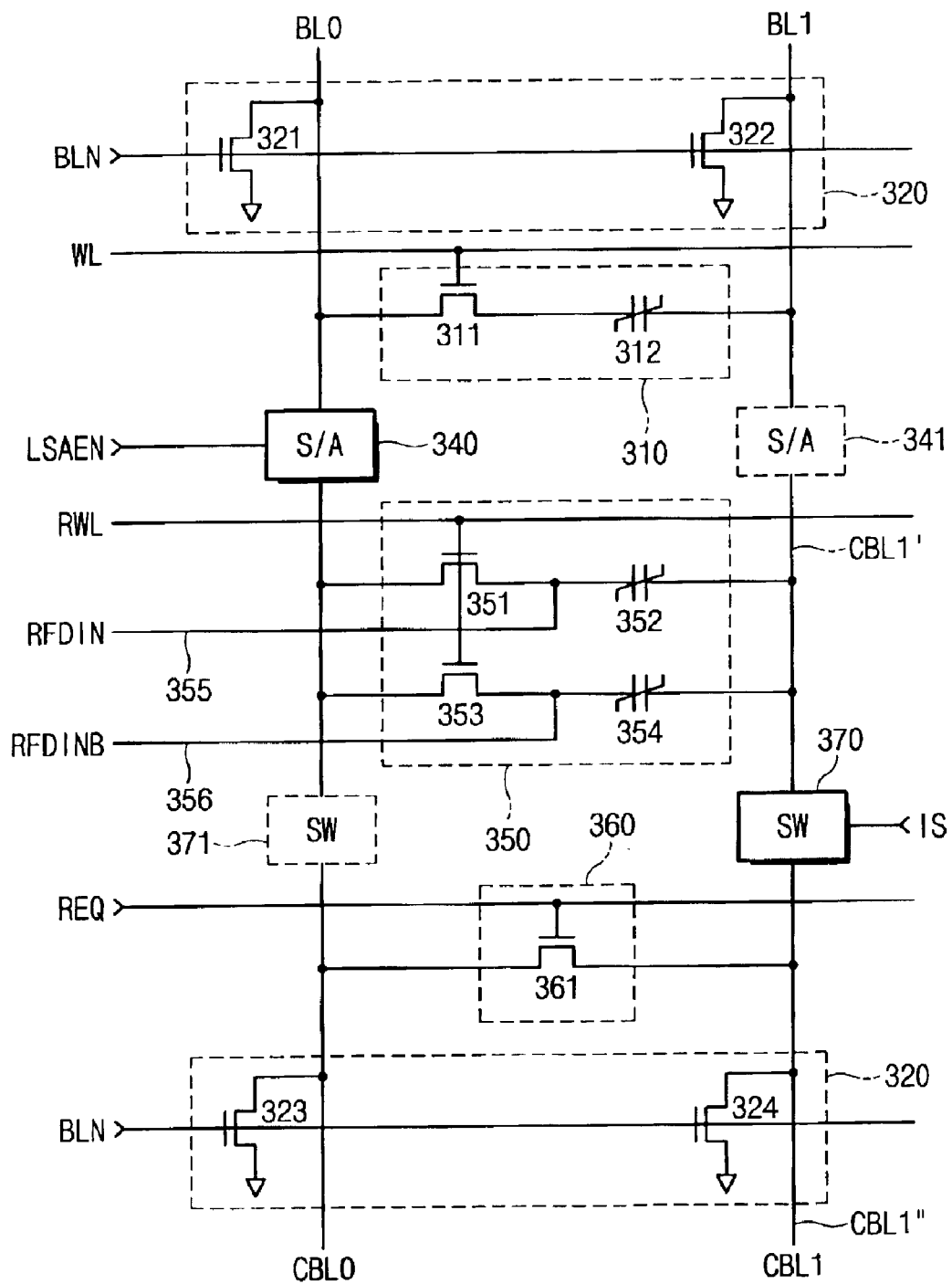
FIG. 3 is a circuit diagram of a conventional semiconductor memory device.
Figure 4:
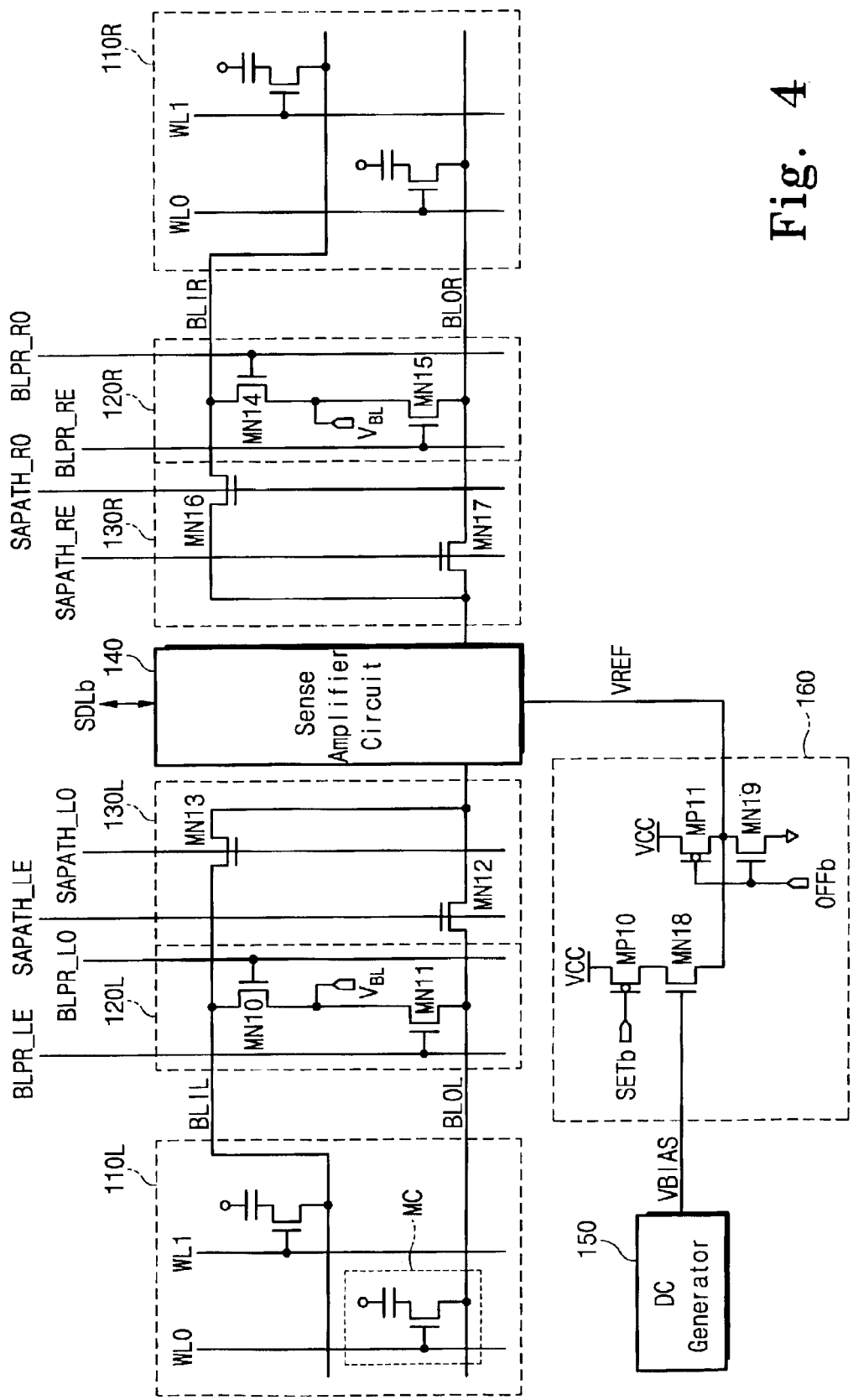
FIG. 4 is a block diagram of memory circuits and control methods according to embodiments of the present invention.

FIG. 4 is a block diagram illustrating semiconductor memory devices according to embodiments of the present invention. The semiconductor memory device includes a shared sense amplifier structure. According to the shared sense amplifier structure, a single sense amplifier is shared by adjacent memory blocks and will be coupled to one of the memory blocks at each of modes of operation. While only two memory blocks 110L and 110R are illustrated in FIG. 4, more memory blocks may be provided to a semiconductor memory device as would be apparent to those skilled in the art. A first memory block 110L includes a pair of bit lines BL0L and BL1L as well as memory cells MC arranged at intersections of word lines WL0 and WL1. A second memory block 110R includes a pair of bit lines BL0R and BL1R as well as memory cells MC arranged at intersections of the word lines WL0 and WL1. Although not shown in the drawings, memory cells in each row can be connected to corresponding plate lines.

The bit lines BL0L and BL1L of the first memory block 110L are connected to a first bit line precharge circuit 120L and to a first bit line switch circuit 130L. The first bit line precharge circuit 120L includes a pair of NMOS transistors MN10 and MN11. The NMOS transistor MN10 is coupled between the bit line BL1L and a precharge voltage $V_{BL}$ and is turned on/off according to a control signal BLPR_LO. The NMOS transistor MN11 is coupled between the bit line BL0L and the precharge voltage $V_{BL}$ and is turned on/off according to a control signal BLPR_LE. The first bit line switch circuit 130L includes a pair of NMOS transistors MN12 and MN13. The NMOS transistor MN12 is coupled between the bit line BL0L and the sense amplifier circuit 140 and is turned on/off according to a control signal SAPATH_LE. The NMOS transistor MN13 is coupled between the bit line BL1L and the sense amplifier circuit 140 and is turned on/off according to a control signal SAPATH_LO.

When a memory cell connected to the bit line BL0L of the first memory cell 110L is selected, the control signals BLPR_LE and SAPATH_LE are activated, and the control signals BLPR_LO and SAPATH_LO are inactivated. Accordingly, the bit line BL1L is electrically insulated from the sense amplifier circuit 140. The bit line BL0L is precharged via the NMOS transistor MN11 and is coupled to the sense amplifier circuit 140 via the NMOS transistor MN12. Similarly, when a memory cell connected to the bit line BL1L of the memory block 110L is selected, the control signals BLPR_LO and SAPATH_LO are activated, and the control signals BLPR_LE and SAPATH_LE are inactivated. Accordingly, the bit line BL0L is electrically insulated from the sense amplifier circuit 140. The bit line BL1L is precharged via the NMOS transistor MN10 and is coupled to the sense amplifier circuit 140 via the NMOS transistor MN13.

The bit lines BL0R and BL1R of the second memory block 110R are connected to a second bit line precharge circuit 120R and to a second bit line switch circuit 130R. The second bit line precharge circuit 120R is formed of a pair of NMOS transistors MN14 and MN15. The NMOS transistor MN14 is coupled between the bit line BL1R and the precharge voltage $V_{BL}$ and is turned on/off according to a control signal BLPR_RO. The NMOS transistor MN15 is coupled between the bit line BL0R and the precharge voltage $V_{BL}$ and is turned on/off according to a control signal BLPR_RE. The second bit line switch circuit 130R is formed of a pair of NMOS transistors MN16 and MN17. The NMOS transistor MN16 is coupled between the bit line BL1R and the sense amplifier circuit 140 and is turned on/off according to a control signal SAPATH_RO. The NMOS transistor MN17 is coupled between the bit line BL0R and the sense amplifier circuit 140 and is turned on/off according to a control signal SAPATH_RE.

In operation, when a memory cell connected to the bit line BL0R of the second memory block 110R is selected, the control signals BLPR_RE and SAPATH_RE are activated, and the control signals BLPR_RO and SAPATH_RO are inactivated. Accordingly, the bit line BL1R is electrically insulated from the sense amplifier circuit 140. The bit line BL0R is precharged via the NMOS transistor MN15 and is coupled to the sense amplifier circuit 140 via the NMOS transistor MN17. Similarly, when a memory cell connected to the bit line BL1R of the memory block 110R is selected, the control signals BLPR_RO and SAPATH_RO are activated, and the control signals BLPR_RE and SAPATH_RE are inactivated. Accordingly, the bit line BL0R is electrically insulated from the sense amplifier circuit 140. The bit line BL1R is precharged via the NMOS transistor MN14 and is coupled to the sense amplifier circuit 140 via the NMOS transistor MN16.

Referring to FIG. 4, the sense amplifier circuit 140 receives the reference VREF and senses a voltage on a bit line connected via the first or second bit line switch circuit 130L or 130R. The sensing result is output on a data line SDLb. Because data is sensed using a voltage on a single bit line, only one data line SDLb is connected to the sense amplifier circuit 140. As a result, an operating time of the sense amplifier can be shortened and a chip size can be reduced.

The semiconductor memory device of the present invention further comprises a direct current (DC) voltage generating circuit 150 and a reference voltage generating circuit 160. The DC voltage generating circuit 150 generates a stable bias voltage $V_{BIAS}$ using a power supply voltage and can be, for example, a bandgap reference voltage generating circuit. The reference voltage generating circuit 160 receives the bias voltage $V_{BIAS}$ and generates the reference voltage VREF in response to control signals SETb and OFFb. The reference voltage generating circuit 160 includes a pair of PMOS transistors MP10 and MP11 and a pair of NMOS transistors MN18 and MN19. The PMOS transistor MP10 and the NMOS transistor MN18 are connected in cascade between a power supply voltage VCC and the reference voltage VREF line. The control signal SETb is coupled to a gate of the PMOS transistor MP10, and a gate of the NMOS transistor MN18 is coupled to the bias voltage $V_{BIAS}$. The PMOS transistor MP11 is coupled between the power supply voltage VCC and the reference voltage VREF line, and the NMOS transistor MN19 is coupled between the reference voltage VREF line and the ground voltage GND. The control signal OFFb is coupled to the gate of the PMOS transistor MP11 and to the gate of the NMOS transistor MN19.

In operation, when the control signals SETb and OFFb are at a high level, the PMOS transistors MP10 and MP11 are turned off, and the NMOS transistor MN19 is turned on. That is, the reference voltage VREF becomes a ground voltage, which is hereinafter referred to as "a first reference voltage". When the control signal SETb is at a low level and the control signal OFFb is at a high level, the PMOS transistor MP10 and the NMOS transistor MN19 are turned on, and the PMOS transistor MP11 is turned off. The reference voltage generating circuit 160 generates the reference voltage VREF lower than the bias voltage $V_{BIAS}$, which is hereinafter referred to as "a second reference voltage". The second reference voltage VREF has an intermediate level between a bit line level of data "1" and a bit line level of data "0", and may be optimized by adjusting a resistance ratio of the PMOS and NMOS transistors MP10, MN18, and MN19. When the control signals SETb and OFFb are at a low level, the NMOS transistor MP19 is turned off, the PMOS transistor MP11 and the PMOS transistor MP10 are both turned on. That is, the reference voltage VREF becomes a power supply voltage VCC, which is hereinafter referred to as a "third reference voltage".

According to the present invention, the semiconductor memory device provides reference voltage generating circuits corresponding respectively to a plurality of sense amplifiers. The reference voltage generating circuit is disposed at a region adjacent to the sense amplifier, and the DC voltage generating circuit 150 supplies the bias voltage $V_{BIAS}$ to all the reference voltage generating circuits 160. This is because the reference voltage can be approximately several hundred mV and locating the reference voltage generating circuit 160 adjacent to the sense amplifier can provide a more stable reference voltage to the sense amplifier.

Figure 5:
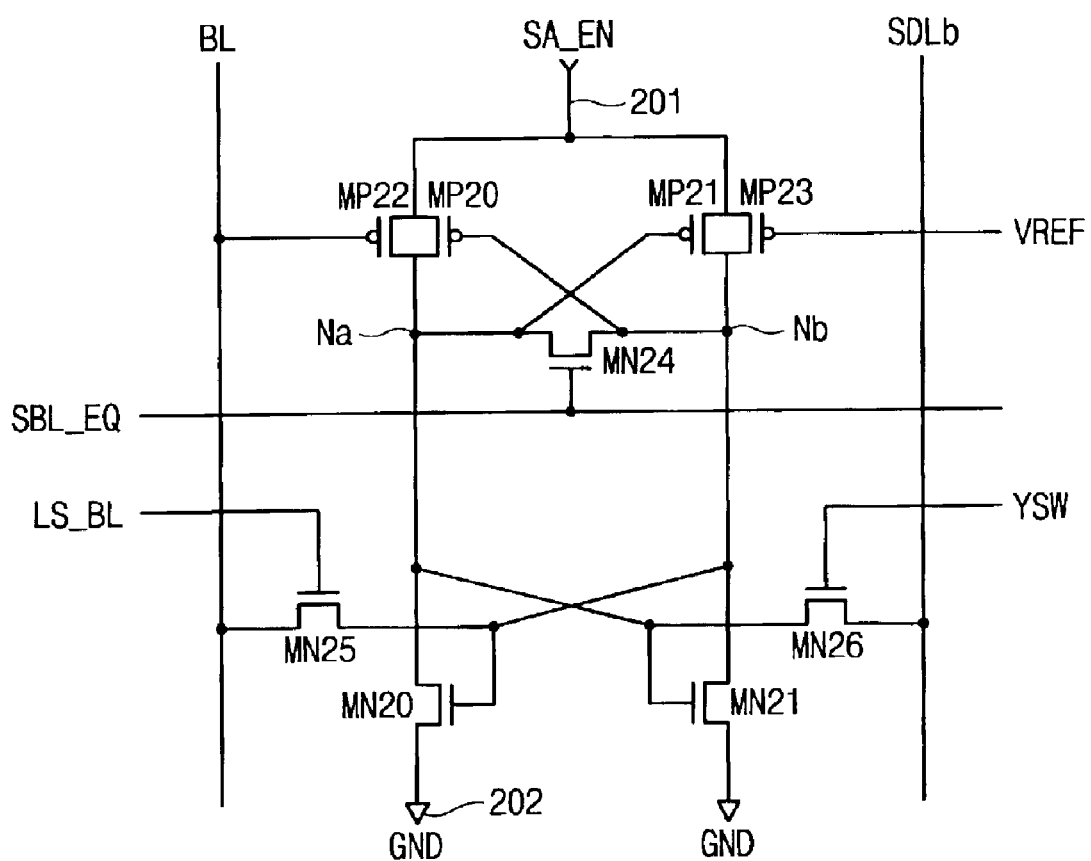
FIG. 5 is a circuit diagram of a sense amplifier circuit according to embodiments of the present invention.

FIG. 5 is a preferred embodiment of the sense amplifier of FIG. 4. The sense amplifier circuit 140 of the present invention includes a latch-type sense amplifier. The latch-type sense amplifier is coupled between a signal line 201 receiving a sense amplification enable signal SA_EN and a signal line 202 receiving a ground voltage GND. The latch-type sense amplifier is formed of a pair of PMOS transistors MP20 and MP21 and a pair of NMOS transistors MN20 and MN21. The sense amplifier can amplify a minute voltage difference that exists across the first and second terminals Na and Nb. The PMOS transistor MP20 provides a current path between the signal line 201 and the first terminal Na which is controlled by the gate of the PMOS transistor MP20 connected to the second terminal Nb. The PMOS transistor MP21 provides a current path between the signal line 201 and the second terminal Nb which is controlled by the gate of the PMOS transistor MP21 which is connected to the first terminal Na. The NMOS transistor MN21 has a gate connected to the first terminal Na and is coupled between the second terminal Nb and the signal line 202. The NMOS transistor MN20 provides a current path between the first terminal Na and the signal line 202 which is controlled by the gate of the NMOS transistor MN20 which is connected to the second terminal Nb.

The sense amplifier circuit 140 of the present invention includes PMOS transistors MP22 and MP23 as active load elements. The PMOS transistor MP22 is coupled between the signal line 201 and the first terminal Na and has a resistance value varied according to a voltage of the bit line BL. That is, a current amount of the PMOS transistor MP22 is controlled (or determined) by a voltage of the bit line BL. The PMOS transistor MP23 is coupled between the signal line 201 and the second terminal Nb and has a resistance value varied according to the reference voltage from the reference voltage generating circuit 160. That is, a current amount of the PMOS transistor MP23 is controlled (determined) by a reference voltage VREF.

As shown in FIG. 5, the bit line BL and the sense amplifier are not directly coupled to each other. In particular, the transistors MP22 and MP23 can provide the voltage levels present on bit line BL and bit line SDLD to the sense amplifier circuit 140 which can then be amplified and provided on the first and second terminals Na and Nb.

Referring to FIG. 5, an NMOS transistor MN24 is coupled as an equalizer between the first and second terminals Na and Nb and is controlled by a control signal SBL_EQ. Here, the control signal SBL_EQ is activated high prior to an operation of the latch-type sense amplifier and is inactivated low during the operation of the latch-type sense amplifier. Accordingly, the NMOS transistor MN24 can equalize the voltages applied to the respective gates of transistors MP20, MP21, MN20 and MN21 prior to operation of the sense amplifier circuit 140. An NMOS transistor MN25 is coupled between the bit line BL and the second terminal Nb, and an NMOS transistor MN26 is coupled between the first terminal Na and the data line SDLb. The NMOS transistor MN25 is controlled by a control signal LS_BL, and the NMOS transistor NM26 is controlled by a control signal YSW. Here, the NMOS transistor NM25 transfers an amplified voltage at the second terminal Nb to the bit line BL, and the NMOS transistor MN26 transfers an amplified voltage at the first terminal Na to the data line SDLb.

In some embodiments according to the present invention, the PMOS transistors MP20 and MP21 are formed to have the same channel width-to-length (W/L) ratio, and the NMOS transistors MN20 and MN21 are formed to have the same channel W/L ratio. Likewise, the PMOS transistors MP22 and MP23 are formed to have the same channel W/L ratio, and the NMOS transistors MN25 and MN26 are formed to have the same channel W/L ratio.

Figure 6:
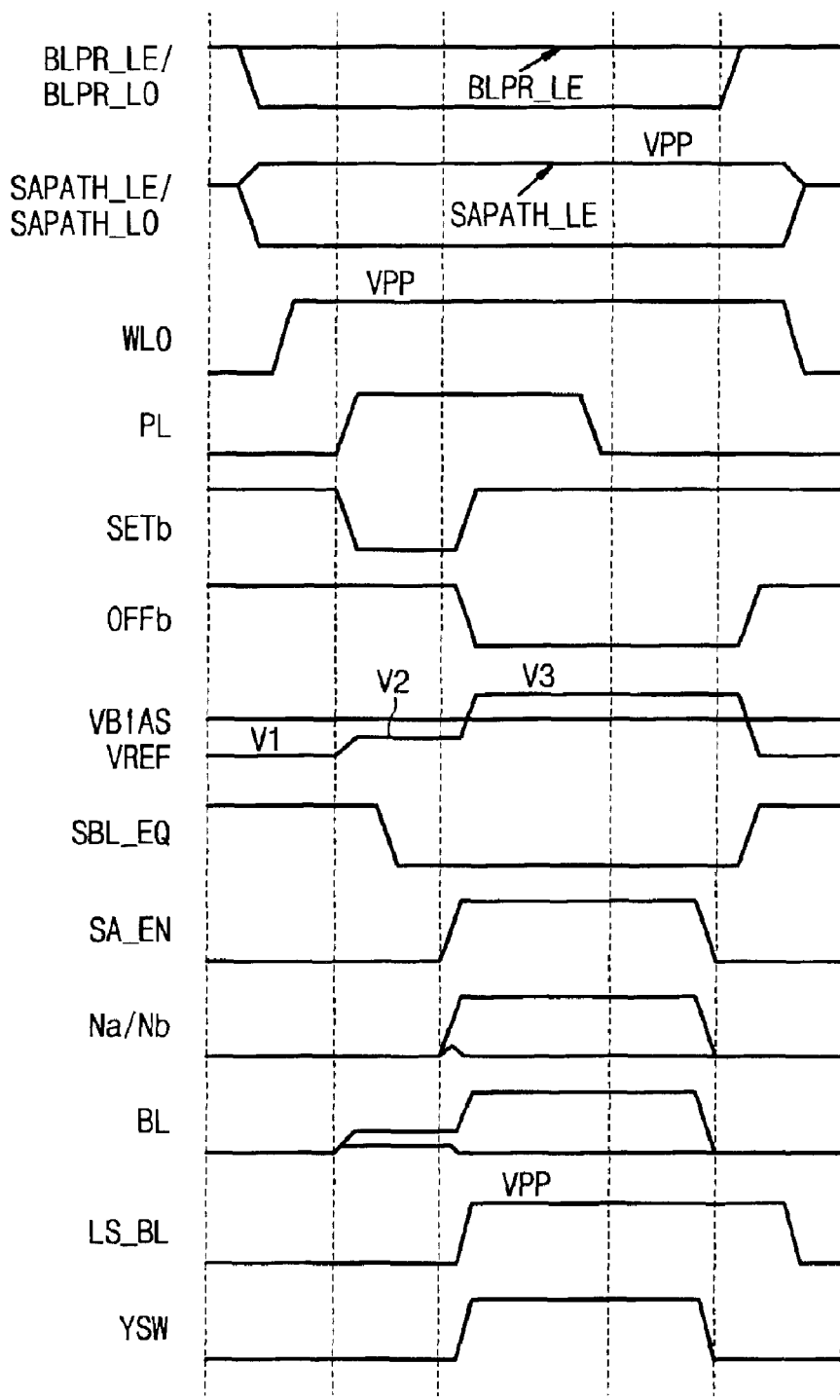
FIG. 6 is a timing diagram of memory circuit operations according to embodiments of the present invention.

FIG. 6 is a timing diagram illustrating a read operation of the semiconductor memory device according to the present invention. With reference to drawings, the read operation of the semiconductor memory device according to the present invention will be described in detail hereinafter. As a matter of convenience, supposing that a memory cell connected to the bit line BL0L of the first memory block 110L is accessed, the bit lines BL0R and BL1R of the second memory block 110R are electrically insulated from the sense amplifier circuit 140. That is, the control signals BLPR_RO, BLPR_RE, SAPATH_RO, and SAPATH_RE are inactivated.

In operation, the control signals BLPR_LE and SAPATH_LE are activated. Thus, the bit line BL0L is charged with a precharge voltage VBL and is electrically connected to the sense amplifier circuit 140. At this time, because the control signals BLPR_LO and SAPATH_LO are inactivated, the bit line BL1L is electrically insulated from the sense amplifier circuit 140. While the control signal SBL_EQ is maintained at a high level, the first and second terminals Na and Nb of the sense amplifier are equalized. That is, when the control signal SBL_EQ is at a high level, the NMOS transistor MN24 is turned on, and the first and second terminals Na and Nb are electrically connected to each other. Here, the first and second terminals Na and Nb may be set to a ground voltage. For example, the first and second terminals Na and Nb may have a ground voltage by connecting the first and second terminals Na and Nb to the bit line BL via the NMOS transistor MN25. On the other hand, the first and second terminals Na and Nb may maintain a floating state. This is because all the control signals SETb and OFFb are at a high level.

Next, the word line WL0 is activated, and a plate line PL is then activated. Thus, electric charges stored in the selected memory cell MC are transferred to the bit line BL0L. In other words, a voltage of the bit line is varied according to data stored in the memory cell. At the same time, as the control signal SETb transitions from a high level to a low level, the reference voltage generating circuit 160 generates the second reference voltage VREF lower than the bias voltage $V_{BIAS}$. Continuously, while the control signal SBL_EQ makes a high-to-low transition, the sense amplification enable signal SA_EN transitions from a low level of a ground voltage GND to a high level of a power supply voltage VCC. In other embodiments according to the present invention, the sense amplification enable signal SA_EN is a static signal which is maintained at the power supply voltage VCC throughout operation of the sense amplifier circuit 140. At this time, the PMOS transistors MP22 and MP23 have different gate-source voltages Vgs. This is because a reference voltage VREF is different from a bit line BL voltage applied to gates of the PMOS transistors MP22 and MP23. Consequently, different amounts of currents flow into the first and second terminals Na and Nb via the PMOS transistors MP22 and MP23, respectively. That is, there arises a minute voltage difference between the first and second terminals Na and Nb. The voltage difference can be amplified by the transistors MP10, MP11, MN10 and MN11 configured as the latch-type sense amplifier circuit 140.

For example, when a memory cell of data '1' is accessed, a voltage of the bit line BL is higher than the reference voltage VREF. Because the PMOS transistors MP22 and MP23 function as active load elements, a current to the PMOS transistor MP22 is less than that through the PMOS transistor MP23, thereby causing the voltage at the first terminal Na to be less than the voltage at the second terminal Nb. In particular, the voltage drop across the PMOS transistor MP22 is greater than the voltage drop across the PMOS transistor MP23 thereby causing the voltage at the first terminal Nb to be lower than the voltage at the second terminal Na. The lower voltage at the first terminal Na causes the NMOS transistor MN21 to switch off, thereby causing the respective voltages at the first and second terminals Na and Nb to diverge. In particular, the lower voltage at the first terminal Na causes the NMOS transistor MN21 to switch off thereby allowing the voltage at the second terminal Nb to be pulled towards the supply voltage (SA_EN) which, in turn, causes the PMOS transistor MP20 to turn off thereby causing the voltage at the first terminal Na to increase further towards GND thereby providing the amplified voltages at the first and second terminals Na, Nb.

After a sense operation is sufficiently performed, the control signal SETb becomes a high level and the control signal OFFb becomes a low level. As a result, a reference voltage VREF applied to the PMOS transistor MP23 is changed from the second reference voltage to the third reference voltage VCC. Thus, the PMOS transistor MP23 is completely turned off. As the control signals LS_EN and YSW transition from low levels to high levels, an amplified voltage of the first terminal Na is transferred to the data line SDLb via the NMOS transistor MN26, and an amplified voltage of the second terminal Nb is transferred to the bit line BL via the NMOS transistor MN25. If sensed data is transferred to the data line SDLb (or, if a sense operation is completed), the control signal OFFb transitions from a low level to a high level. Thus, the reference voltage VREF becomes a ground voltage, and this enables an undesired current to be cut off during subsequent operations.

In the semiconductor memory device of the present invention, a voltage level of the bit line BL connected to a memory cell MC is sensed according to current amounts which are determined by the gate-source voltages of the PMOS transistors MN22 and MN23. By using the NMOS transistor MN24 as an equalizer, a difference between the gate-source voltages of the PMOS transistors MP22 and MP23 prior to an operation of the sense amplifier can be reduced. That is, because the first and second terminals Na and Nb are equalized to the same voltage level before the operation of the sense amplifier, when the control signal SA_EN is activated, the PMOS transistors MP20 and MP21 and the NMOS transistors MN20 and MN21 are set to have the same gate voltage. In contrast, in conventional systems, the first and second terminals Na and Nb may have different voltage levels due to, for example, noise. This difference in voltage levels can cause the operating conditions of the PMOS transistors MP22 and MP23 to be determined by not only a gate-voltage but also by other voltages. Accordingly, conventional systems may have difficulty in performing the sensing operation as discussed above.

According to the sense amplifier circuit of the present invention, the bit line BL voltage and the reference voltage VREF can be indirectly coupled to the first and second terminals Na and Nb of the latch-type sense amplifier. Accordingly, it is possible to reduce the problems associated with charge/discharge currents associated with conventional systems caused by voltage differences between the bit lines BLM and BLR which are greater than a turn-on voltage of the PMOS transistor or the NMOS transistor. Also, because only one bit line is connected to the sense amplifier circuit 140, an operating time of the sense amplifier circuit may be shortened. Similarly, because only one data line is connected to the sense amplifier circuit 140, a chip size may be scaled down. In addition, it is unnecessary to transfer the reference voltage VREF to the bit line BL using the capacitor so that an operating speed of the sense amplifier circuit may be improved.

Figure 7:
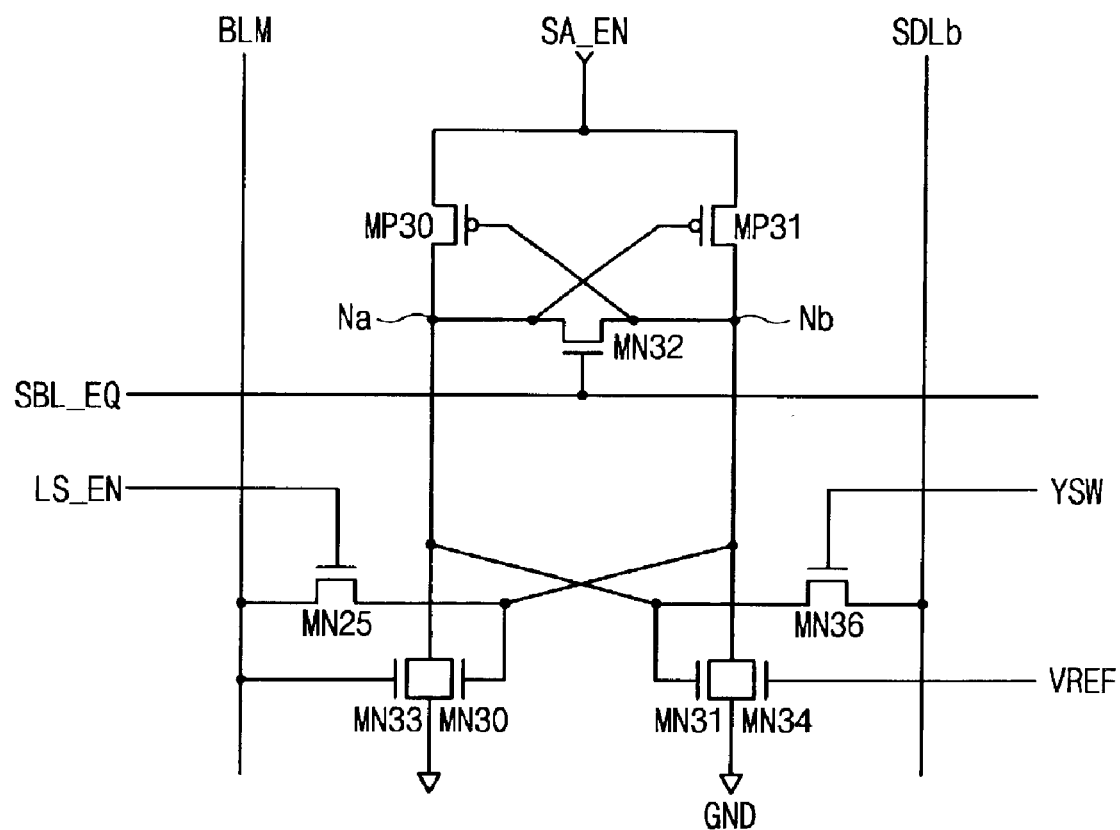
FIG. 7 is a circuit diagram of a sense amplifier circuit according to embodiments of the present invention.

FIG. 7 is a circuit diagram that illustrates sense amplifier circuits according to embodiments of the present invention. The sense amplifier circuit 300 of FIG. 7 is the same as that of FIG. 5 except that the sense amplifier circuit 300 of FIG. 7 adopts as active load elements NMOS transistors MN33 and MN34 instead of the PMOS transistors MP22 and MP23. The NMOS transistor MN33 has a current path formed between the first terminal Na and the ground voltage GND as well as a gate connected to the bit line BL. The NMOS transistor MN34 has a current path formed between the second terminal Nb and the ground voltage GND as well as a gate connected to the reference voltage VREF. Because the sense amplifier circuit of FIG. 7 performs the substantially same operations as that of FIG. 5, descriptions of those operations will be omitted here for brevity.

In the present embodiment according to the present invention, a voltage level of the bit line BL connected to the memory cell MC is sensed according to current amounts which are determined by gate-source voltages of the NMOS transistors MN33 and MN34. When the sense amplifier circuit of FIG. 7 is used under the state that the bit line BL voltage and the reference voltage VREF are lower than turn-on voltages of the NMOS transistors MN33 and MN3, a sensing time and a sense performance may be decreased. Therefore, to perform an improved sense operation, the bit line BL voltage and the reference voltage VREF should be set to be higher than the turn-on voltages of the NMOS transistors MN33 and MN34.

As described above, a latch-type sense amplifier may be embodied such that a bit line voltage and a reference voltage are indirectly coupled to input/output terminals in the sense amplifier circuit. Thus, an operating speed of the sense amplifier circuit may be improved. Because only one bit line is connected to the sense amplifier circuit, an operating time of the sense amplifier circuit may be shortened. Also, data is transferred from/to the sense amplifier circuit via only one data line, thereby reducing a chip size. In addition, because the reference voltage is changed to a power supply voltage after performing a sense amplification operation, it is capable of reducing power consumption of currents.

While the present invention has been described in connection with description of the preferred embodiment and drawings thereof, it is capable of various changes and modifications without departing from the spirit and scope of the invention.

What is claimed is:

1. A semiconductor memory device comprising:
   at least a pair of bit lines;
   a selection circuit for selecting one of the bit lines;
   a precharge circuit for precharging the selected bit line;
   a direct current (DC) voltage generating circuit for generating a predetermined bias voltage using a power supply voltage;
   a reference voltage generating circuit for receiving the bias voltage to generate a reference voltage in response to first and second control signals, wherein die reference voltage is lower than the bias voltage; and
   a sense amplifier circuit for performing a sense and amplification operation according to a voltage on the selected bit line and the reference voltage, wherein the sense amplifier circuit comprises:
      first and second signal lines;
      a sense amplifier coupled between the first and second signal lines for amplifying a voltage difference between first and second terminals;
      an equalizer coupled between the first and second terminals for equalizing voltages of the first and second terminals in response to a third control signal;
      a first active load element coupled between the first signal line and the first terminal and having a resistance value varied according to a voltage of the selected bit line; and
      a second active load element coupled between the first signal line and the second terminal and having a resistance value varied according to the reference voltage; and
   wherein the first signal line receives a ground voltage or a power supply voltage according to an operation of the sense amplifier, and the second signal line is fixed to a ground voltage.

2. The semiconductor memory device as claimed in claim 1, wherein the first signal line receives the ground voltage when the third control signal line is activated, and receives the power supply voltage when the third control signal line is inactivated.

3. The semiconductor memory device as claimed in claim 1, wherein the first active load element is a PMOS transistor which has a gate coupled to the selected to bit line, a source coupled to the first signal line, and a drain coupled to the first terminal.

4. The semiconductor memory device as claimed in claim 1, wherein the second active load element is a PMOS transistor which has a gate coupled to the reference voltage, a source coupled to the first signal line, and a drain coupled to the second terminal.

5. A semiconductor memory device comprising:
   at least a pair of bit lines;
   a selection circuit for selecting one of the bit lines;
   a precharge circuit for precharging the selected bit line;
   a direct current (DC) voltage generating circuit for generating a predetermined bias voltage using a power supply voltage;
   a reference voltage generating circuit for receiving the bias voltage to generate a reference voltage in response to first and second control signals, wherein the reference voltage is lower than the bias voltage; and
   a sense amplifier circuit for performing a sense and amplification operation according to a voltage on the selected bit line and the reference voltage, wherein the sense amplifier circuit comprises:
      first and second signal lines;
      a sense amplifier coupled between the first and second signal lines for amplifying a voltage difference between first and second terminals;
      an equalizer coupled between the first and second terminals for equalizing voltages of the first and second terminals in response to a third control signal;
      a first active load element coupled between the first signal line and the first terminal and having a resistance value varied according to a voltage of the selected bit line; and
      a second active load element coupled between the first signal line and the second terminal and having a resistance value varied according to the reference voltage; and
   wherein the first signal line is fixed to a ground voltage, and the second signal line receives the ground voltage or a power supply voltage according to an operation of the sense amplifier.

6. The semiconductor memory device as claimed in claim 5, wherein the second signal line receives the ground voltage when the third control signal is activated, and receives the power supply voltage when the third control signal is inactivated.

7. The semiconductor memory device as claimed in claim 5, wherein the first active load element is an NMOS transistor which has a gate coupled to the selected bit line, a source coupled to the first signal line, and a drain coupled to the first terminal.

8. The semiconductor memory device as claimed in claim 5, wherein the second active load element is an NMOS transistor which has a gate coupled to the reference voltage, a source coupled to the first signal line, and a drain coupled to the second terminal.

9. A semiconductor memory device comprising:
   at least a pair of bit lines:
   a selection circuit for selecting one of the bit lines;
   a precharge circuit for precharging the selected bit line;
   a direct current (DC) voltage generating circuit for generating a predetermined bias voltage using a power supply voltage;
   a reference voltage generating circuit for receiving the bias voltage to generate a reference voltage in response to first and second control signals, wherein the reference voltage is lower than the bias voltage; and
   a sense amplifier circuit for performing a sense and amplification operation according to a voltage on the selected bit line and the reference voltage, wherein the sense amplifier circuit comprises:
      first and second signal lines;
      a sense amplifier coupled between the first and second signal lines for amplifying a voltage difference between first and second terminals;
      an equalizer coupled between the first and second terminals for equalizing voltages of the first and second terminals in response to a third control signal;
      a first active load element coupled between the first signal line and the first terminal and having a resistance value varied according to a voltage of the selected bit line; and
      a second active load element coupled between the first signal line and the second terminal and having a resistance value varied according to the reference voltage; and
   wherein the sense amplifier circuit further comprises means for transferring an amplified voltage of the first terminal to a data line and an amplified voltage of the second terminal to the selected bit line in response to fourth and fifth control signals.

10. The semiconductor memory device as claimed in claim 9, wherein the means includes first and second NMOS transistors,
   wherein the first NMOS transistor has a drain coupled to the second terminal of the sense amplifier, a source coupled to the selected bit line, and a gate coupled to receive the fourth control signal; and
   wherein the second NMOS transistor has a drain coupled to the first terminal of the sense amplifier, a source coupled to the data line, and a gate coupled to receive the fifth control signal.

11. A semiconductor memory device comprising:
   at least a pair of bit lines;
   a selection circuit for selecting one of the selected bit lines;
   a precharge circuit for precharging the selected bit line;
   a DC voltage generating circuit for generating a predetermined bias voltage using a power supply voltage;
   a reference voltage generating circuit for receiving the bias voltage to generate a reference voltage in response to first and second control signals, wherein the reference voltage is lower than the bias voltage; and
   a sense amplifier circuit for performing a sense and amplification operation according to a voltage on the selected bit line and the reference voltage,
   wherein the sense amplifier circuit comprises;
      a sense amplifier connected to a sense amplification enable signal line and to a ground voltage for amplifying a voltage difference between first and second terminals;
      a first PMOS transistor coupled between the sense amplification enable signal line and the first terminal of the sense amplifier and controlled by a voltage of the selected bit line;
      a second PMOS transistor coupled between the sense amplification enable signal line and the second terminal of the sense amplifier and controlled by the reference voltage;
      a first NMOS transistor coupled between the first and second terminals and controlled by a third control signal;
      a second NMOS transistor coupled between the first terminal of the sense amplifier and the selected bit line; and
      a third NMOS transistor coupled between the second terminal of the sense amplifier and a data line, wherein the second and third NMOS transistors are controlled by fourth and fifth control signals, respectively.

12. The semiconductor memory device as claimed in claim 11, wherein the sense amplification enable signal line receives a ground voltage when the sense amplifier is inactivated, and receives a power supply voltage when the sense amplifier is activated.

13. The semiconductor memory device as claimed in claim 11, wherein when the third control signal is activated, the first and second terminals of the sense amplifier are equalized to one of a floating state and a ground voltage.

14. The semiconductor memory device as claimed in claim 11, wherein after a voltage of the selected bit line is sufficiently sensed, the reference voltage generating circuit generates the reference voltage higher than the bias voltage in response to the control signals.

15. The semiconductor memory device as claimed in claim 11, wherein when an operation of the sense amplifier circuit is completed, the reference voltage generating circuit generates the reference voltage of a ground voltage in response to the control signals.

16. The semiconductor memory device as claimed in claim 11, wherein the reference voltage generating circuit includes first and second PMOS transistors as well as first and second NMOS transistors, wherein the first PMOS transistor and the first NMOS transistor are connected in cascade between the power supply voltage and the reference voltage and are controlled by the control signal and the bias voltage, respectively; wherein the second PMOS transistor is coupled between the power supply voltage and the reference voltage and is controlled by the second control signal; and wherein the second NMOS transistor is coupled between the reference voltage and the ground voltage and is controlled by the second signal.

17. A semiconductor memory device comprising:
   at least a pair of bit lines;
   a selection circuit for selecting one of the bit lines;
   a precharge circuit for precharging the selected bit line;
   a DC current generating circuit for generating a predetermined voltage using a power supply voltage;
   a reference voltage generating circuit for receiving the bias voltage to generate a reference voltage in response to first and second control signals, wherein the reference voltage is lower than the bias voltage; and a sense amplifier circuit for performing a sense and amplification operation according to a voltage on the selected bit line and the reference voltage, wherein the sense amplifier circuit comprises;

a sense amplifier connected to a sense amplification enable signal line and to a ground voltage for amplifying a voltage difference between first and second terminals;

a first NMOS transistor coupled between the first terminal of the sense amplifier and a ground voltage and controlled by a voltage of the selected bit line;

a second NMOS transistor coupled between the second terminal of the sense amplifier and the ground voltage and controlled by the reference voltage;

a third NMOS transistor coupled between the first and second terminals and controlled by a third control signal;

a fourth NMOS transistor coupled between the second terminal of the sense amplifier and the selected bit line; and a fifth NMOS transistor coupled between the first terminal of the sense amplifier and a data line, wherein the fourth and fifth NMOS transistors are controlled by fourth and fifth control signals, respectively.

18. The semiconductor memory device as claimed in claim 17, wherein the sense amplification enable signal line receives a ground voltage when the sense amplifier is inactivated, and receives power supply voltage when the sense amplifier is activated.

19. The semiconductor memory device as claimed in claim 17, wherein when the third control signal is activated, the first and second terminals of the sense amplifier are equalized to one of a floating state and a ground voltage.

20. The semiconductor memory device as claimed in claim 17, wherein after a voltage of the selected bit line is sufficiently sensed, the reference voltage generating circuit generates the reference voltage higher than the bias voltage in response to the control signals.

21. The semiconductor memory device as claimed in claim 17, wherein when an operation of the sense amplifier circuit is completed, the reference voltage generating circuit generates the reference voltage of a ground voltage in response to the control signals.

22. The semiconductor memory device as claimed in claim 17, wherein the reference voltage generating circuit includes first and second PMOS transistor a as well as first and second NMOS transistors, wherein the first PMOS transistor and the first NMOS transistor are connected in cascade between the power supply voltage and the reference voltage and are controlled by the control signal and the bias voltage, respectively; wherein the second PMOS transistor is coupled between the power supply voltage and the reference voltage and is controlled by the second control signal; and wherein the second NMOS transistor is connected between the reference voltage and a ground voltage and is controlled by the second control signal.

* * * * *

UNITED STATES PATENT AND TRADEMARK OFFICE
CERTIFICATE OF CORRECTION

PATENT NO. : 6,914,836 B2
DATED : July 5, 2005
INVENTOR(S) : Jeon et al.

It is certified that error appears in the above-identified patent and that said Letters Patent is hereby corrected as shown below:

Column 11,
Line 51, should read -- to first and second control signals, wherein the refer- --.

Column 16,
Line 18, should read -- includes first and second PMOS transistors as well as first --.

Signed and Sealed this

Twenty-seventh Day of December, 2005

JON W. DUDAS
*Director of the United States Patent and Trademark Office*